United States Patent
Huang et al.

(10) Patent No.: US 12,328,126 B2
(45) Date of Patent: Jun. 10, 2025

(54) METHOD AND APPARATUS FOR APPLYING PHASE SHIFT TO DIGITAL PHASE-LOCKED LOOP CIRCUIT TO ADJUST FREQUENCY OF LOCAL OSCILLATOR SIGNAL USED BY DOWN-CONVERSION

(71) Applicant: Airoha Technology Corp., Hsinchu (TW)

(72) Inventors: Chun-Yuan Huang, Hsinchu County (TW); Chin-Chang Chang, Tainan (TW); Jeng-Hong Chen, Manhattan Beach, CA (US); Yun-Xuan Zhang, Taipei (TW)

(73) Assignee: Airoha Technology Corp., Hsinchu (TW)

( * ) Notice: Subject to any disclaimer, the term of this patent is extended or adjusted under 35 U.S.C. 154(b) by 70 days.

(21) Appl. No.: 18/229,161

(22) Filed: Aug. 1, 2023

(65) Prior Publication Data

US 2024/0204786 A1    Jun. 20, 2024

Related U.S. Application Data

(60) Provisional application No. 63/433,765, filed on Dec. 20, 2022.

(51) Int. Cl.
| | |
|---|---|
| *H04B 1/69* | (2011.01) |
| *H03L 7/081* | (2006.01) |
| *H03L 7/099* | (2006.01) |
| *H04B 1/707* | (2011.01) |
| *H04B 1/713* | (2011.01) |

(52) U.S. Cl.
CPC .......... *H03L 7/0991* (2013.01); *H03L 7/0814* (2013.01)

(58) Field of Classification Search
CPC ..... H03L 7/0991; H03L 7/0814; H03L 7/104; G01S 13/343
USPC ......................................... 375/132–139, 260
See application file for complete search history.

(56) References Cited

U.S. PATENT DOCUMENTS

| | | | |
|---|---|---|---|
| 5,325,075 A | 6/1994 | Rapeli | |
| 11,437,957 B2 * | 9/2022 | Boz | .......... H03L 7/104 |
| 2006/0261906 A1 | 11/2006 | Hsiao | |
| 2011/0170476 A1 | 7/2011 | Shapira et al. | |
| 2023/0115807 A1* | 4/2023 | Bunsen | ................. G01S 13/343 |
| | | | 342/128 |

FOREIGN PATENT DOCUMENTS

| | | |
|---|---|---|
| EP | 1 303 919 B1 | 9/2006 |
| KR | 10-1250162 B1 | 4/2013 |

* cited by examiner

*Primary Examiner* — Phuong Phu
(74) *Attorney, Agent, or Firm* — Winston Hsu

(57) ABSTRACT

A wireless communication device includes a receiver circuit, a phase shift control circuit, and a digital phase-locked loop (DPLL) circuit. The receiver circuit includes a down-converter circuit that is used to apply down-conversion to an input signal according to a local oscillator (LO) signal. The phase shift control circuit is used to generate a phase shift signal. The DPLL circuit is used to generate the LO signal locked to an initial frequency under a frequency-lock state. In response to the phase shift signal, the DPLL circuit is further used to make the LO signal have a different frequency without leaving the frequency-lock state.

10 Claims, 3 Drawing Sheets

METHOD AND APPARATUS FOR APPLYING PHASE SHIFT TO DIGITAL PHASE-LOCKED LOOP CIRCUIT TO ADJUST FREQUENCY OF LOCAL OSCILLATOR SIGNAL USED BY DOWN-CONVERSION

CROSS REFERENCE TO RELATED APPLICATIONS

This application claims the benefit of U.S. Provisional Application No. 63/433,765, filed on Dec. 20, 2022. The content of the application is incorporated herein by reference.

BACKGROUND OF THE INVENTION

1. Field of the Invention

The present invention relates to wireless communications, and more particularly, to a method and apparatus for applying phase shift to a digital phase-locked loop circuit to adjust a frequency of a local oscillator signal used by down-conversion.

2. Description of the Prior Art

Interference is one of the biggest challenges for any wireless technology in providing reliable communications. Since different wireless technologies, such as Bluetooth (BT) and wireless fidelity (Wi-Fi), may share the same transmission medium, it is possible for a packet that is being transmitted to be corrupted or lost if it collides with another packet being transmitted at the exact same time and on the same frequency channel. One of the techniques that BT technology uses to overcome interference and find a proper transmission path that avoids packet collision is frequency-hopping. In accordance with the frequency-hopping mechanism, a BT device divides the frequency band into smaller channels, and rapidly hops between those channels when transmitting packets. To ensure that channels selected by the frequency-hopping mechanism of the BT device are clean channels not used by other wireless communication devices such as Wi-Fi device (s) and other BT device (s), the BT device is required to scan channels populated within the 2.4 GHz band, and prevents the frequency-hopping mechanism from selecting BT channels that are interfered with signals transmitted from other wireless communication devices. For example, received signal strength indication (RSSI) measurement is commonly used by a BT device to determine if a channel is currently used by other wireless communication devices. If an analog oscillator (e.g., a voltage-controlled oscillator) is used to generate a local oscillator (LO) signal, it requires a long lock-in time to make the LO signal locked to one specific LO frequency needed by RSSI measurement of each of the channels. Thus, there is a need for an innovative RSSI measurement design that can accomplish a BT channel scan procedure rapidly.

SUMMARY OF THE INVENTION

One of the objectives of the claimed invention is to provide a method and apparatus for applying phase shift to a digital phase-locked loop circuit to adjust a frequency of a local oscillator signal used by down-conversion.

According to a first aspect of the present invention, an exemplary wireless communication device is disclosed. The exemplary wireless communication device includes a receiver circuit, a phase shift control circuit, and a digital phase-locked loop (DPLL) circuit. The receiver circuit includes a down-converter circuit that is arranged to apply down-conversion to an input signal according to a local oscillator (LO) signal. The phase shift control circuit is arranged to generate a phase shift signal. The DPLL circuit is arranged to generate the LO signal locked to an initial frequency under a frequency-lock state. In response to the phase shift signal, the DPLL circuit is further arranged to make the LO signal have a different frequency without leaving the frequency-lock state.

According to a second aspect of the present invention, an exemplary wireless communication method is disclosed. The exemplary wireless communication method includes: applying down-conversion to an input signal according to a local oscillator (LO) signal; utilizing a digital phase-locked loop (DPLL) circuit to generate the LO signal locked to an initial frequency under a frequency-lock state; and generating and outputting a phase shift signal to the DPLL circuit, wherein in response to the phase shift signal, the DPLL circuit makes the LO signal have a different frequency without leaving the frequency-lock state.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
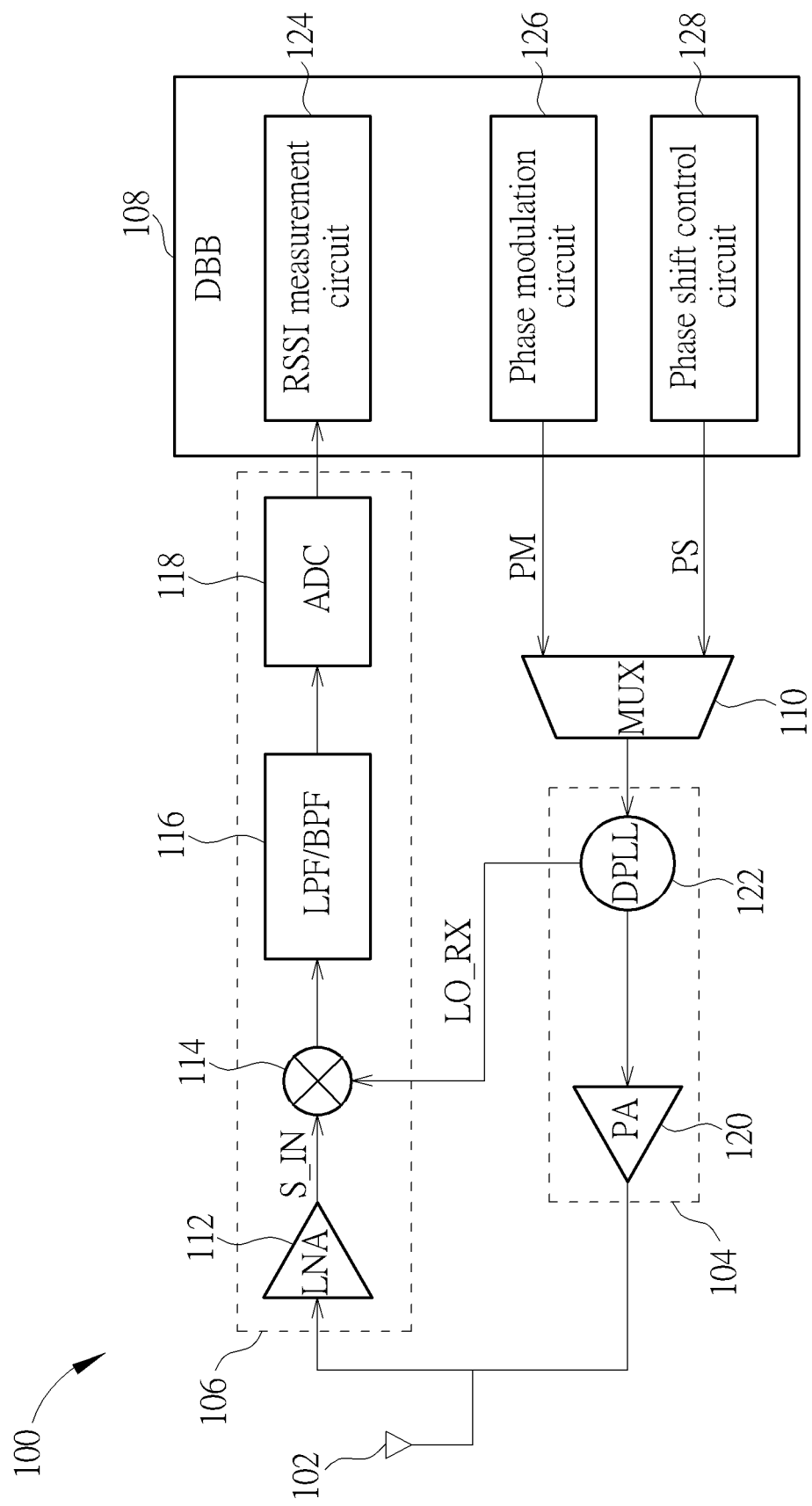
FIG. 1 is a diagram illustrating a wireless communication device according to an embodiment of the present invention.

FIG. 1 is a diagram illustrating a wireless communication device 100 according to an embodiment of the present invention. For example, the wireless communication device 100 may be a BT device. However, this is for illustrative purposes only, and is not meant to be a limitation of the present invention. In practice, any wireless communication device 100 using the proposed circuit design for a particular purpose (e.g. fast RSSI measurement) falls within the scope of the present invention. Additionally, for example, the wireless communication device 100 is integrated in an integrated circuit.

As shown in FIG. 1, the wireless communication device 100 includes an antenna 102, a transmitter circuit 104, a receiver circuit 106, a digital baseband circuit (labeled by "DBB") 108, and a multiplexer (MUX) 110. The receiver circuit 106 includes a low-noise amplifier (LNA) 112, a down-converter circuit (e.g., a mixer) 114, a low-pass filter (LPF)/band-pass filter (BPF) 116, and an analog-to-digital converter (ADC) 118. The transmitter circuit 104 includes a power amplifier (PA) 120 and a digital phase-locked loop circuit (labeled by "DPLL") 122. The digital baseband circuit 108 includes an RSSI measurement circuit 124, a phase modulation circuit 126, and a phase shift control circuit 128.

The phase modulation circuit 126 and the phase shift control circuit 128 may be function blocks of a transmit (TX) modulator-demodulator (modem), where the phase modulation circuit 126 is active when the DPLL circuit 122 (which is a part of the transmitter circuit 104) normally operates during a period in which a normal TX operation is used for packet transmission, and the phase shift control circuit 128 is active when the DPLL circuit 122 (which is a part of the transmitter circuit 104) deliberately operates during a period in which no normal TX operation is used for packet transmission. It should be noted that only the components pertinent to the present invention are illustrated in FIG. 1. In practice, the wireless communication device 100 is allowed to include additional components for achieving other designated functions.

In this embodiment, the down-converter circuit 114 of the receiver circuit 106 is arranged to apply down-conversion to an input signal S_IN (which is an output of the LNA 112) according to a local oscillator (LO) signal LO_RX, and the DPLL circuit 122 (which is a part of the transmitter circuit 104) is arranged to generate a digitally controlled oscillator (DCO) output as the LO signal LO_RX.

Specifically, the DPLL circuit 122 is used by the transmitter circuit 104 when the wireless communication device 100 operates under a TX mode, and is re-used by the receiver circuit 106 when the wireless communication device 100 operates under an RX mode. For example, the transmitter circuit 104 employs a polar transmitter architecture, and the DPLL circuit 122 is intended to deal with phase modulation. Hence, when the wireless communication device 100 operates under the TX mode, the multiplexer circuit 110 selects a phase modulation signal PM output from the phase modulation circuit 126 as an input of the DPLL circuit 122, such that the DCO output of the DPLL circuit 122 contains phase information. When the wireless communication device 100 operates under the RX mode for RSSI measurement, the multiplexer circuit 110 selects a phase shift signal PS (which is a dataless signal) output from the phase shift control circuit 128 as an input of the DPLL circuit 122, and an RX output of the receiver circuit 106 is fed into the RSSI measurement circuit 124 for further processing.

To put it simply, the wireless communication device 100 leverages inherent characteristics of the DPLL circuit 122 to achieve fast RSSI measurement. For example, the DPLL circuit 122 first generates the LO signal LO_RX locked to an initial frequency under a frequency-lock state. Next, in response to the phase shift signal PS, the DPLL circuit 122 makes the LO signal LO_RX have a different frequency without leaving the frequency-lock state. With a proper setting of phase shift values sequentially carried by the phase shift signal PS, the LO signal LO_RX is allowed to have a frequency shift within a range from +9 MHz to −9 MHz under a condition that the DPLL circuit 122 remains at the frequency-lock state.

Figure 2:
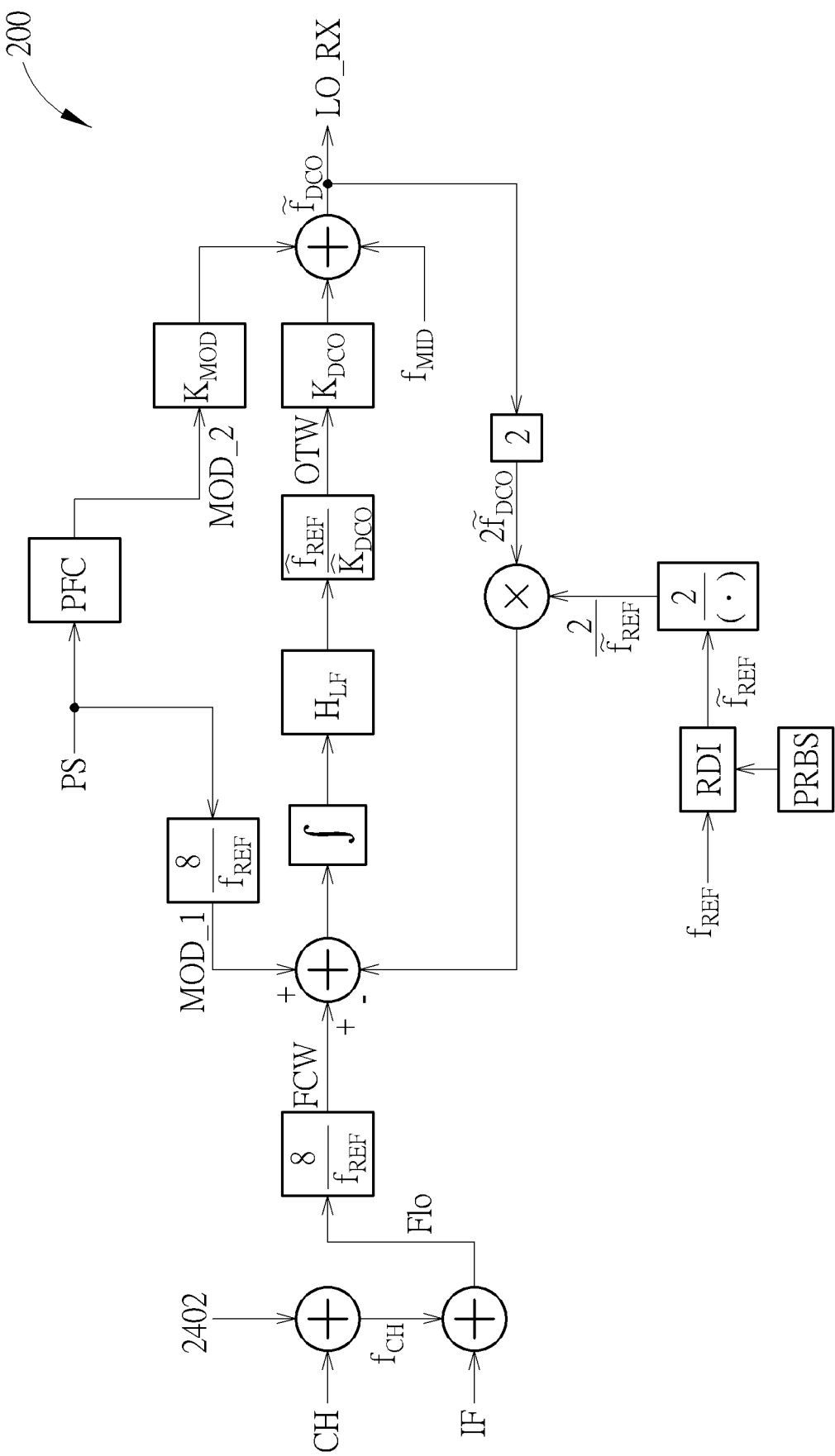
FIG. 2 is a diagram illustrating a two-point modulation DPLL circuit according to an embodiment of the present invention.

In some embodiments of the present invention, the DPLL circuit 122 may be implemented using a two-point modulation DPLL circuit with two modulation inputs both derived from the phase shift signal PS when the wireless communication device 100 operates in the RX mode. FIG. 2 is a diagram illustrating a two-point modulation DPLL circuit according to an embodiment of the present invention. By way of example, but not limitation, the DPLL circuit 200 may be an all-digital phase-locked loop (ADPLL) circuit. The DPLL circuit 122 shown in FIG. 1 may be implemented using the DPLL circuit 200 with a two-point modulation DPLL architecture. It should be noted that the two-point modulation DPLL architecture shown in FIG. 2 is for illustrative purposes only, and is not meant to be a limitation of the present invention. In practice, the present invention has no limitations on the two-point modulation DPLL architecture. That is, any two-point modulation DPLL architecture can be employed by the DPLL circuit 122/200. Since the person skilled in the art can readily understand the principle of the two-point modulation DPLL architecture shown in FIG. 2, further description is omitted here for brevity.

In accordance with the BT specifications, BT basic rate/enhanced data rate (BR/EDR) radio is primarily designed for low power, high data throughput operations. In BT BR/EDR, the radio hops in a pseudo-random way on 79 designated BT channels. Each BT BR/EDR channel has a bandwidth of 1 MHZ, and each frequency fc is located at (2402+CH) MHz, where CH=0, 1, . . . , 78. The phase shift control circuit 128 categorizes 79 BT channels into a plurality of groups, where a channel scan operation of one of the groups is started after a channel scan operation of another of the groups is completed. For example, 79 BT channels may be categorized into 7 groups, as illustrated in the following table.

TABLE 1

| Group | CH | $f_{CH}$ (MHz) | IF (MHz) | $F_{lo}$ (MHz) | ADPLL Locked (MHz) | Frequency Shift (MHz) |
|---|---|---|---|---|---|---|
| 1 | 0 | 2402 | 0.888889 | 2401.11111 | 2406.111111 | −5 |
|  | 1 | 2403 | 0.888889 | 2402.11111 | 2406.111111 | −4 |
|  | 2 | 2404 | 0.888889 | 2403.11111 | 2406.111111 | −3 |
|  | 3 | 2405 | 0.888889 | 2404.11111 | 2406.111111 | −2 |
|  | 4 | 2406 | 0.888889 | 2405.11111 | 2406.111111 | −1 |
|  | 5 | 2407 | 0.888889 | 2406.11111 | 2406.111111 | 0 |
|  | 6 | 2408 | 0.888889 | 2407.11111 | 2406.111111 | 1 |
|  | 7 | 2409 | 0.888889 | 2408.11111 | 2406.111111 | 2 |
|  | 8 | 2410 | 0.888889 | 2409.11111 | 2406.111111 | 3 |
|  | 9 | 2411 | 0.888889 | 2410.11111 | 2406.111111 | 4 |
|  | 10 | 2412 | 0.888889 | 2411.11111 | 2406.111111 | 5 |
| 2 | 11 | 2413 | 0.888889 | 2412.11111 | 2417.111111 | −5 |
|  | 12 | 2414 | 0.888889 | 2413.11111 | 2417.111111 | −4 |
|  | 13 | 2415 | 0.888889 | 2414.11111 | 2417.111111 | −3 |
|  | 14 | 2416 | 0.888889 | 2415.11111 | 2417.111111 | −2 |
|  | 15 | 2417 | 0.888889 | 2416.11111 | 2417.111111 | −1 |
|  | 16 | 2418 | 0.888889 | 2417.11111 | 2417.111111 | 0 |
|  | 17 | 2419 | 0.888889 | 2418.11111 | 2417.111111 | 1 |
|  | 18 | 2420 | 0.888889 | 2419.11111 | 2417.111111 | 2 |
|  | 19 | 2421 | 0.888889 | 2420.11111 | 2417.111111 | 3 |
|  | 20 | 2422 | 0.888889 | 2421.11111 | 2417.111111 | 4 |
|  | 21 | 2423 | 0.888889 | 2422.11111 | 2417.111111 | 5 |
| 3 | 22 | 2424 | 0.888889 | 2423.11111 | 2428.111111 | −5 |
|  | 23 | 2425 | 0.888889 | 2424.11111 | 2428.111111 | −4 |
|  | 24 | 2426 | 0.888889 | 2425.11111 | 2428.111111 | −3 |
|  | 25 | 2427 | 0.888889 | 2426.11111 | 2428.111111 | −2 |

TABLE 1-continued

| Group | CH | $f_{CH}$ (MHz) | IF (MHz) | $F_{lo}$ (MHz) | ADPLL Locked (MHz) | Frequency Shift (MHz) |
|---|---|---|---|---|---|---|
|  | 26 | 2428 | 0.888889 | 2427.11111 | 2428.111111 | -1 |
|  | 27 | 2429 | 0.888889 | 2428.11111 | 2428.111111 | 0 |
|  | 28 | 2430 | 0.888889 | 2429.11111 | 2428.111111 | 1 |
|  | 29 | 2431 | 0.888889 | 2430.11111 | 2428.111111 | 2 |
|  | 30 | 2432 | 0.888889 | 2431.11111 | 2428.111111 | 3 |
|  | 31 | 2433 | 0.888889 | 2432.11111 | 2428.111111 | 4 |
|  | 32 | 2434 | 0.888889 | 2433.11111 | 2428.111111 | 5 |
| 4 | 33 | 2435 | 0.888889 | 2434.11111 | 2439.111111 | -5 |
|  | 34 | 2436 | 0.888889 | 2435.11111 | 2439.111111 | -4 |
|  | 35 | 2437 | 0.888889 | 2436.11111 | 2439.111111 | -3 |
|  | 36 | 2438 | 0.888889 | 2437.11111 | 2439.111111 | -2 |
|  | 37 | 2439 | 0.888889 | 2438.11111 | 2439.111111 | -1 |
|  | 38 | 2440 | 0.888889 | 2439.11111 | 2439.111111 | 0 |
|  | 39 | 2441 | 0.888889 | 2440.11111 | 2439.111111 | 1 |
|  | 40 | 2442 | 0.888889 | 2441.11111 | 2439.111111 | 2 |
|  | 41 | 2443 | 0.888889 | 2442.11111 | 2439.111111 | 3 |
|  | 42 | 2444 | 0.888889 | 2443.11111 | 2439.111111 | 4 |
|  | 43 | 2445 | 0.888889 | 2444.11111 | 2439.111111 | 5 |
| 5 | 44 | 2446 | 0.888889 | 2445.11111 | 2450.111111 | -5 |
|  | 45 | 2447 | 0.888889 | 2446.11111 | 2450.111111 | -4 |
|  | 46 | 2448 | 0.888889 | 2447.11111 | 2450.111111 | -3 |
|  | 47 | 2449 | 0.888889 | 2448.11111 | 2450.111111 | -2 |
|  | 48 | 2450 | 0.888889 | 2449.11111 | 2450.111111 | -1 |
|  | 49 | 2451 | 0.888889 | 2450.11111 | 2450.111111 | 0 |
|  | 50 | 2452 | 0.888889 | 2451.11111 | 2450.111111 | 1 |
|  | 51 | 2453 | 0.888889 | 2452.11111 | 2450.111111 | 2 |
|  | 52 | 2454 | 0.888889 | 2453.11111 | 2450.111111 | 3 |
|  | 53 | 2455 | 0.888889 | 2454.11111 | 2450.111111 | 4 |
|  | 54 | 2456 | 0.888889 | 2455.11111 | 2450.111111 | 5 |
| 6 | 55 | 2457 | 0.888889 | 2456.11111 | 2461.111111 | -5 |
|  | 56 | 2458 | 0.888889 | 2457.11111 | 2461.111111 | -4 |
|  | 57 | 2459 | 0.888889 | 2458.11111 | 2461.111111 | -3 |
|  | 58 | 2460 | 0.888889 | 2459.11111 | 2461.111111 | -2 |
|  | 59 | 2461 | 0.888889 | 2460.11111 | 2461.111111 | -1 |
|  | 60 | 2462 | 0.888889 | 2461.11111 | 2461.111111 | 0 |
|  | 61 | 2463 | 0.888889 | 2462.11111 | 2461.111111 | 1 |
|  | 62 | 2464 | 0.888889 | 2463.11111 | 2461.111111 | 2 |
|  | 63 | 2465 | 0.888889 | 2464.11111 | 2461.111111 | 3 |
|  | 64 | 2466 | 0.888889 | 2465.11111 | 2461.111111 | 4 |
|  | 65 | 2467 | 0.888889 | 2466.11111 | 2461.111111 | 5 |
|  | 66 | 2468 | 0.888889 | 2467.11111 | 2461.111111 | 6 |
| 7 | 67 | 2469 | 0.888889 | 2468.11111 | 2473.111111 | -5 |
|  | 68 | 2470 | 0.888889 | 2469.11111 | 2473.111111 | -4 |
|  | 69 | 2471 | 0.888889 | 2470.11111 | 2473.111111 | -3 |
|  | 70 | 2472 | 0.888889 | 2471.11111 | 2473.111111 | -2 |
|  | 71 | 2473 | 0.888889 | 2472.11111 | 2473.111111 | -1 |
|  | 72 | 2474 | 0.888889 | 2473.11111 | 2473.111111 | 0 |
|  | 73 | 2475 | 0.888889 | 2474.11111 | 2473.111111 | 1 |
|  | 74 | 2476 | 0.888889 | 2475.11111 | 2473.111111 | 2 |
|  | 75 | 2477 | 0.888889 | 2476.11111 | 2473.111111 | 3 |
|  | 76 | 2478 | 0.888889 | 2477.11111 | 2473.111111 | 4 |
|  | 77 | 2479 | 0.888889 | 2478.11111 | 2473.111111 | 5 |
|  | 78 | 2480 | 0.888889 | 2479.11111 | 2473.111111 | 6 |

The DPLL circuit 200 generates the LO signal LO_RX locked to an initial frequency under a frequency-lock state, and then makes the LO signal LO_RX have frequency shifts sequentially controlled by the phase shift signal PS without leaving the frequency-lock state. For example, a center channel in each group is initially selected, and the DPLL circuit 200 is locked to an initial frequency before any frequency shift is applied to the LO frequency Flo of the LO signal LO_RX. As illustrated in the above table, assuming that the intermediate frequency (IF) is 0.888889 MHZ (i.e., 8/9 MHZ), the DPLL circuit 200 is locked to 2406.11111 MHz for CH=5 (i.e., (2402+CH)-8/9 MHZ) when a channel scan operation is performed upon the 1$^{st}$ group (which consists of CH=0, . . . , 10), locked to 2417.11111 MHz for CH=16 (i.e., (2402+CH)-8/9 MHZ) when a channel scan operation is performed upon the 2$^{nd}$ group (which consists of CH=11, . . . , 21), locked to 2428.11111 MHz for CH=27 (i.e., (2402+CH)-8/9 MHZ) when a channel scan operation is performed upon the 3$^{rd}$ group (which consists of CH=22, . . . , 32), locked to 2439.11111 MHz for CH=38 (i.e., (2402+CH)-8/9 MHZ) when a channel scan operation is performed upon the 4th group (which consists of CH=33, . . . , 43), locked to 2450.11111 MHz for CH=49 (i.e., (2402+CH)-8/9 MHZ) when a channel scan operation is performed upon the 5$^{th}$ group (which consists of CH=44, . . . , 54), locked to 2461.11111 MHz for CH=60 (i.e., (2402+CH)-8/9 MHZ) when a channel scan operation is performed upon the 6$^{th}$ group (which consists of CH=55, . . . , 66), and locked to 2473.11111 MHz for CH=72 (i.e., (2402+CH)-8/9 MHZ) when a channel scan operation is performed upon the 7$^{th}$ group (which consists of CH=67, . . . , 78).

After the DPLL circuit 200 is locked to an initial frequency for a particular group, the phase shift control circuit 128 generates the phase shift signal PS to the DPLL circuit 200, where both of the modulation inputs MOD 1 and MOD 2 are derived from the same phase shift value carried by the phase shift signal PS, such that a frequency control word FCW fed into an accumulator is adjusted due to the modulation input MOD 1, and the oscillator tuning word OTW fed into a DCO is adjusted due to the modulation input MOD 2. Specifically, regarding channel scan of each group, the DPLL circuit 200 is locked to one particularly specified frequency once, and the LO frequency Flo of the LO signal LO_RX is shifted to different frequency values under control of the phase shift signal PS.

Figure 3:
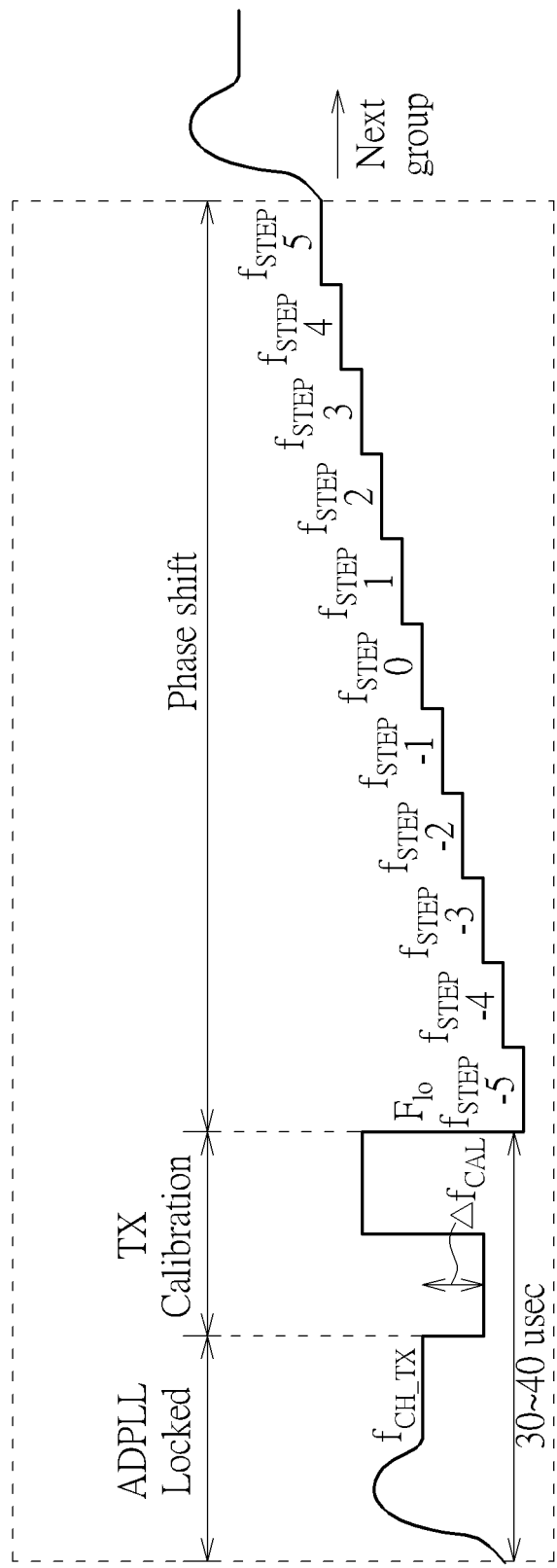
FIG. 3 is a diagram illustrating behavior of a DPLL circuit during RSSI measurement according to an embodiment of the present invention.

FIG. 3 is a diagram illustrating behavior of the DPLL circuit 122/200 during RX RSSI measurement according to an embodiment of the present invention. The RX RSSI measurement requires the DPLL circuit 122/200 to scan frequencies from CH=0 to CH=78. As mentioned above, all channels within the BT band (2402 MHZ-2480 MHz) are categorized into several groups, and a per-group channel scan operation is performed to scan channels categorized into the same group. As shown in FIG. 3, after the DPLL circuit 200 is locked to one particularly specified frequency $f_{CH\_TX}$ ($f_{CH\_TX}$=(2402+CH)-8/9 MHZ), a TX calibration operation may be needed due to the fact the gain value $K_{MOD}$ of the DPLL circuit 200 may vary from channel to channel. Next, the TX modulation path of the two-point modulation DPLL circuit 200 is re-used for receiving a dataless signal (which includes a sequence of phase shift values that is intended to force the DCO output frequency to have different frequency shifts $F_{STEP}$ (MHZ) with respect to the locked frequency $f_{CH\_TX}$) to change the frequency $F_{lo}$ of the LO signal LO_RX to different frequency values (e.g., ($f_{CH\_TX}$-5) MHZ, ($f_{CH\_TX}$-4) MHZ, ($f_{CH\_TX}$-3) MHZ, ($f_{CH\_TX}$-2) MHZ, ($f_{CH\_TX}$-1) MHZ, ($f_{CH\_TX}$-0) MHZ, ($f_{CH\_TX}$+1) MHZ, ($f_{CH\_TX}$+2) MHZ, ($f_{CH\_TX}$+3) MHZ, ($f_{CH\_TX}$+4) MHZ, ($f_{CH\_TX}$+5) MHz) during a period in which the DPLL circuit 200 is still locked to the particularly specified frequency $f_{CH\_TX}$ ($f_{CH\_TX}$=(2402+CH)-8/9 MHZ).

Compared to a conventional design that uses an analog oscillator (e.g., VCO) to lock to different frequencies for all of the channels to be scanned, the proposed design uses a DPLL circuit to lock to one particularly specified frequency once in each group consisting of multiple channels, and generates a phase shift signal to directly change the DCO output frequency of the DPLL circuit under a frequency-lock state. Since the number of frequency-locking operations required by the proposed design can be greatly reduced compared to the conventional design, fast RSSI measurement can be achieved. Specifically, if each frequency locking operation may experience "ADPLL Locked" and "TX Calibration", it would take 30 to 40 microseconds. In the present invention, for channels in the same group, there is no longer need to undergo the aforementioned two operations, which are replaced with a "phase shift" operation. For example, the "phase shift" operation may only consume about 0.1 microseconds. In a case where the number of channels in the same group is equal to 11 and each frequency locking operation undergoes both "ADPLL Locked" and "TX Calibration", it is required to consume longer processing time that is within a range of 11*30~ 11*40 microseconds. However, the present invention may consume shorter processing time that is within a range of 1*30+0.1*11~ 1*40+0.1*11 microseconds.

Furthermore, the proposed design benefits from the DPLL circuit due to its advantages over the analog oscillator (e.g., VCO), such as more accurate locked frequency, shorter lock-in time, more flexibility, and process-insensitive applicability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wireless communication device comprising:
   a receiver circuit, comprising:
      a down-converter circuit, arranged to apply down-conversion to an input signal according to a local oscillator (LO) signal;
   a phase shift control circuit, arranged to generate a phase shift signal;
   a digital phase-locked loop (DPLL) circuit, arranged to generate the LO signal locked to an initial frequency under a frequency-lock state, wherein in response to the phase shift signal, the DPLL circuit is further arranged to make the LO signal have a different frequency without leaving the frequency-lock state; and
   a transmitter circuit;
   wherein the DPLL circuit is a part of the transmitter circuit; and the DPLL circuit is used by the transmitter circuit for receiving a phase modulation signal and generating a digitally controlled oscillator (DCO) output that contains phase information when the wireless communication device operates under a transmit (TX) mode, and is re-used by the receiver circuit when the wireless communication device operates under a receive (RX) mode.

2. The wireless communication device of claim 1, wherein the DPLL circuit is a two-point modulation DPLL circuit with two modulation inputs both derived from the phase shift signal.

3. The wireless communication device of claim 1, wherein the phase shift signal delivers a sequence of different phase shift values; in response to one of the different phase shift values, the DPLL circuit makes the LO signal have a first frequency different from the initial frequency without leaving the frequency-lock state; and in response to another of the different phase shift values, the DPLL circuit makes the LO signal have a second frequency different from the initial frequency without leaving the frequency-lock state.

4. The wireless communication device of claim 1, wherein the wireless communication device is a Bluetooth device.

5. The wireless communication device of claim 4, wherein the phase shift control circuit generates the phase shift signal during received signal strength indication (RSSI) measurement of a plurality of channels of the Bluetooth device.

6. A wireless communication method comprising:
   applying down-conversion to an input signal according to a local oscillator (LO) signal;
   utilizing a digital phase-locked loop (DPLL) circuit to generate the LO signal locked to an initial frequency under a frequency-lock state; and
   generating and outputting a phase shift signal to the DPLL circuit, wherein in response to the phase shift signal, the DPLL circuit makes the LO signal have a different frequency without leaving the frequency-lock state;
   wherein the DPLL circuit is used to receive a phase modulation signal and generate a digitally controlled oscillator (DCO) output that contains phase information under a transmit (TX) mode, and is re-used under a receive (RX) mode.

7. The wireless communication method of claim 6, wherein the DPLL circuit is a two-point modulation DPLL circuit with two modulation inputs both derived from the phase shift signal.

8. The wireless communication method of claim 6, wherein the phase shift signal delivers a sequence of different phase shift values; in response to one of the different phase shift values, the DPLL circuit makes the LO signal have a first frequency different from the initial frequency without leaving the frequency-lock state; and in response to another of the different phase shift values, the DPLL circuit makes the LO signal have a second frequency different from the initial frequency without leaving the frequency-lock state.

9. The wireless communication method of claim 6, wherein the wireless communication method is employed by a Bluetooth device.

10. The wireless communication method of claim 9, wherein generating and outputting the phase shift signal to the DPLL circuit comprises:
    generating the phase shift signal during received signal strength indication (RSSI) measurement of a plurality of channels of the Bluetooth device.

* * * * *